United States Patent
Tain et al.

(10) Patent No.: US 7,312,478 B2
(45) Date of Patent: Dec. 25, 2007

(54) SIDE STRUCTURE OF A BARE LED AND BACKLIGHT MODULE THEREOF

(75) Inventors: Ra-Min Tain, Jhonghe (TW); Shyi-Ching Liau, Hsinchu (TW); Tzong-Che Ho, Hsinchu (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 146 days.

(21) Appl. No.: 11/023,487

(22) Filed: Dec. 29, 2004

(65) Prior Publication Data
US 2006/0027827 A1    Feb. 9, 2006

(30) Foreign Application Priority Data
Aug. 3, 2004    (TW) ................. 93123219 A

(51) Int. Cl.
*H01L 29/22*    (2006.01)
(52) U.S. Cl. .......................... 257/99; 257/88
(58) Field of Classification Search .............. 257/99, 257/88, 98, 713
See application file for complete search history.

(56) References Cited

U.S. PATENT DOCUMENTS

| | | | | |
|---|---|---|---|---|
| 5,936,264 | A | * | 8/1999 | Ishinaga ................. 257/99 |
| 6,611,000 | B2 | * | 8/2003 | Tamura et al. ........... 257/80 |
| 6,969,189 | B2 | * | 11/2005 | Lee et al. ............... 362/631 |
| 7,126,163 | B2 | * | 10/2006 | Katoh .................... 257/99 |

* cited by examiner

*Primary Examiner*—Mark V. Prenty
(74) *Attorney, Agent, or Firm*—Bacon & Thomas, PLLC

(57) ABSTRACT

The present invention discloses a side structure of a bare LED and a backlight module thereof, wherein the backlight module is preferably a light source of a display device such as an LCD device. The backlight module includes a flat plate covered with a thermally conductive dielectric material, a plurality of the side structures of the bare LEDs placed on the flat plate and in contact with the thermally conductive dielectric material, and a plurality of reflection parts also placed on the flat plate, each side structure of each bare LED includes a bare LED and two electrically conductive materials coupled to two bonding pads of the side structure of the bare LED respectively, and positioned on the flat plate therefor.

15 Claims, 6 Drawing Sheets

SIDE STRUCTURE OF A BARE LED AND BACKLIGHT MODULE THEREOF

BACKGROUND OF THE INVENTION

1. Field of the Invention

The present invention relates to a structure of a bare light-emitting diode and a backlight module including a plurality of the bare light-emitting diodes, and more particularly to a side structure of the bare light-emitting diode and a backlight module including a plurality of the side structure of the bare light-emitting diodes.

2. Description of Related Art

A light-emitting diode (LED) is an active light source which has advantages of high efficiency, low power consumption, high brightness and compact volume, so the LED has become well known as an excellent light source. Furthermore, a plurality of LEDs can be arranged on a plate to form a planar light source, or even a colored planar light source or a white planar light source by combining red, green, blue or another color LEDs, so as to serve as the backlight source of a flat panel display.

Referring to FIG. 1, a traditionally bare LED 10 is composed of a quantity of layers of elements including an anode bonding pad 12 for electrical connection to the positive electrode of an external power source and a cathode bonding pad 22 for connection to the negative electrode of the external power source. In addition, there are a GaAs substrate 14, a P-type epitaxy layer 16, an active layer 18 and an N-type epitaxy layer 20 disposed in order between the anode bonding pad 12 and the cathode bonding pad 22. It is well known that the GaAs is just an exemplary material herein, a transparent material such as GaP can be used for replacing the GaAs substrate 14.

When power is supplied from the external power source, an electrical current is fed to the anode bonding pad 12 of the traditionally bare LED 10 and outputted from the cathode bonding pad 22 of the traditionally bare LED 10 to form an electrical loop. When electrons meet electronic holes in the active layer 18, optical energy is discharged so that the traditionally bare LED 10 is illuminated. Even so, the traditionally bare LED 10 can't supply an optimal brightness because both the anode bonding pad 12 and the cathode bonding pad 22 are both made of nontransparent materials.

Nevertheless, many patents have disclosed methods to form a planar light source by incorporating a quantity of the traditionally bare LEDs 10. For instance, U.S. Pat. No. 6,666,567, entitled "Methods and apparatus for a light source with a raised LED", discloses a packaged structure of a raised LED and method of making same, wherein a raised LED 400 comprises a diode 402 and which is encased in a translucent rectangular package 404, shown in FIG. 2. The translucent rectangular package 404 has a support system 450 on the two sides thereof to support the raised LED 400 above a floor 410. The support system 405 includes L-brackets 406 and 408 connecting to a lead frame 412 at both ends of the diode 402 so as to electrically connect to the input terminal and the output terminal of the external power. Although the raised LED 400 provides more light beams than the traditional bare LED 10, heat dissipation now becomes a problem. Also, the translucent rectangular package 404 increases the overall size of the raised LED 400. Therefore, the LED structure will not meet with the user's requirements for high-brightness bare LED and high-brightness active light source composed of LEDs.

Therefore, it is desirable to provide an improved/side-mounted structure of a light-emitting diode bare chip and a backlight module having the side-mounted light-emitting diode bare chip to mitigate and/or obviate the aforementioned problems.

SUMMARY OF THE INVENTION

To avoid the aforesaid defects, the present invention provides a side structure of a bare light-emitting diode mounted on a surface of a carrying plate, comprising: a bare light-emitting diode and at least two conductive materials coupled to the first bonding pad and the second bonding pad respectively so that the bare light-emitting diode is mounted on the surface of said carrying plate. The bare light-emitting diode further comprises: a first bonding pad; a substrate coupled to the first bonding pad; a P-type epitaxy coupled to the light transmission substrate; an active layer coupled to the P-type epitaxy; an N-type epitaxy coupled to the active layer; and a second bonding pad coupled to the N-type epitaxy.

To avoid the aforesaid defects, the present invention also provides a backlight module served as a backlight source of a display device, comprising: a carrying plate mounted with a material capable of thermal conductivity; and a plurality of side structures of a bare light-emitting diodes disposed on said carrying plate and in contact with the material.

In addition, the substrate may be a GaAs or GaP substrate, the carrying plate is preferably a metal plate coated, sputtered or implanted with a thermally conductive dielectric material, and the side structure of the bare light-emitting diode preferably has a passivation layer on the surface thereof. The passivation layer has a refraction coefficient which is larger than the refraction coefficient of air and smaller than the refraction coefficient of the surface of the side structure bare light-emitting diode. The display device is preferable a liquid crystal display, and a heat dissipating device such as a fan, a cooler or fins is preferable attached on the other surface.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
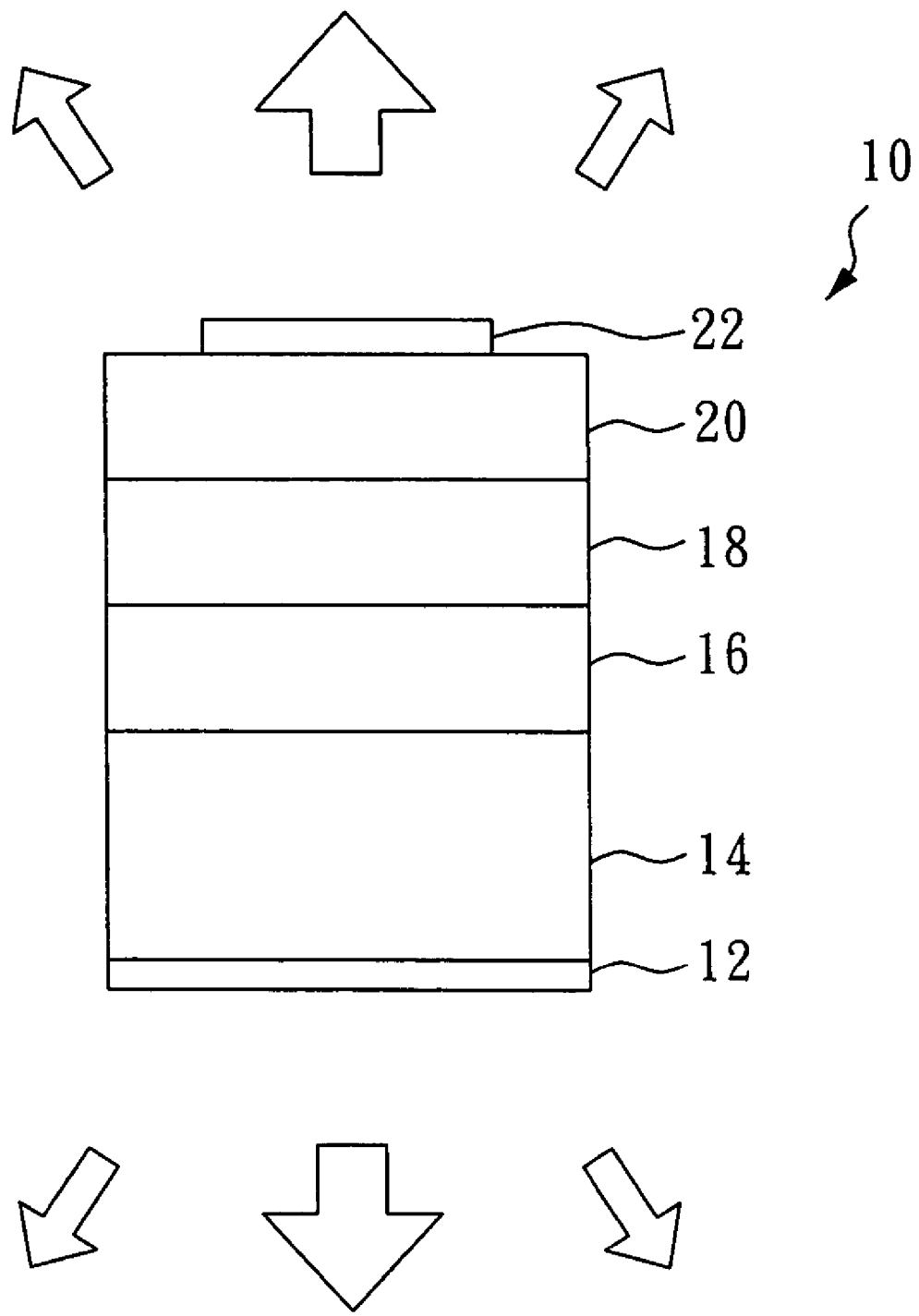
FIG. 1 is a schematic view of a traditionally bare LED.
Figure 2:
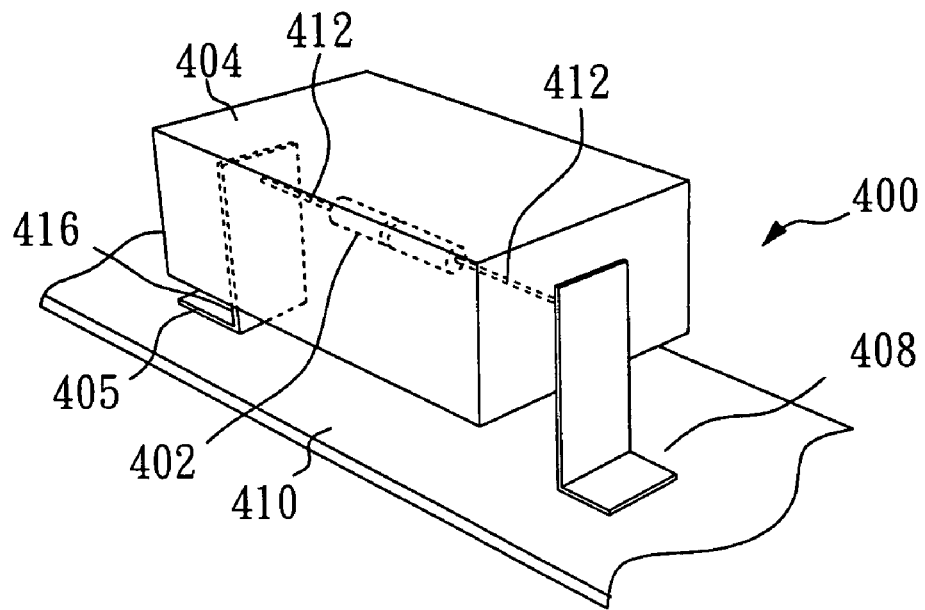
FIG. 2 is a schematic view of a traditional LED.
Figure 3:
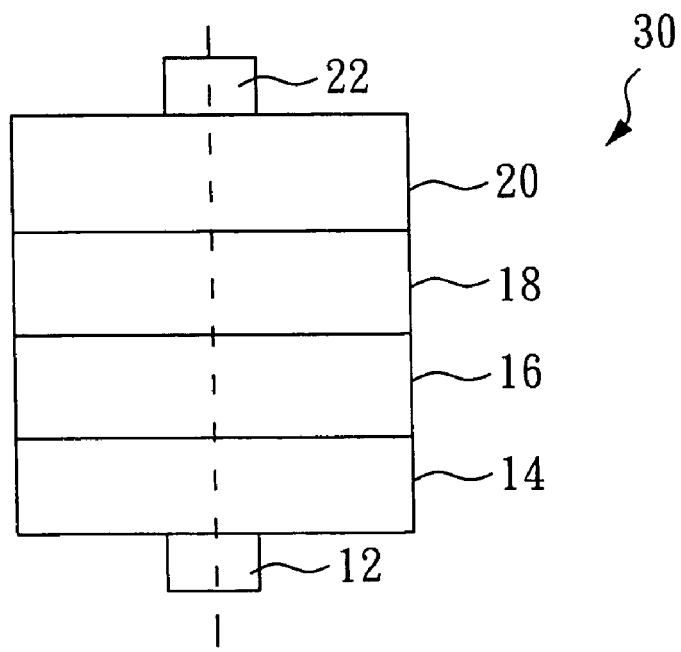
FIG. 3 is a schematic view of a bare LED.
Figure 4:
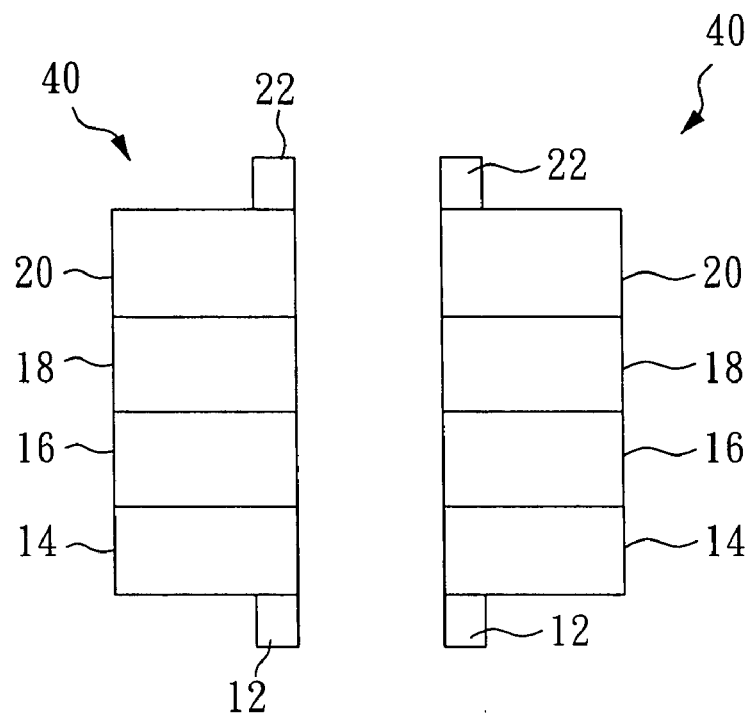
FIG. 4 is a schematic view of a bare LED according to the present invention.
Figures 5A, 5B:
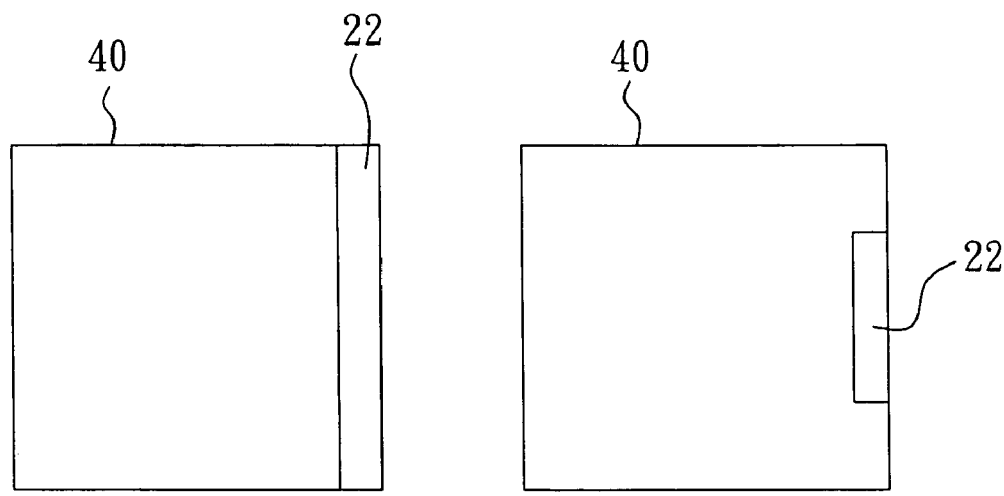
FIG. 5A is a top view of the bare LED according to the present invention.
FIG. 5B is another top view of the bare LED according to the present invention.

Referring to FIG. 3, the fabrication of a bare LED 30 is similar to a process for fabricating the traditionally bare LED 10, therefore the cost of the manufacture of the former does not significantly increase. The difference between the bare LED 30 and the traditionally bare LED 10 is that the anode bonding pad 12 and the cathode bonding pad 22 are positioned at the center of the bare LED 30 having a pattern not specifically defined. Referring to FIG. 4, the bare LED 30 is cut along the center line thereof to become two bare LEDs 40 of the present invention. Referring to FIGS. 5A and 5B, when viewing the bare LED 40 from the top of the bare LED 40, the cathode bonding pad 22 of the bare LED 40 closes to one lateral side (that is, the position where the LED bare chip is cut), so does the anode bonding pad 12 (not shown). Preferably, the patterns of the anode bonding pad 12 and the cathode bonding pad 22 are in the shape of a quadrangle. Because the anode bonding pad 12 and the cathode bonding pad 22 are mounted on the lateral side of the bare LED 40, only part of the light beams are shielded. Thus, the brightness provided by the bare LED 40 is increased.

Figure 6:
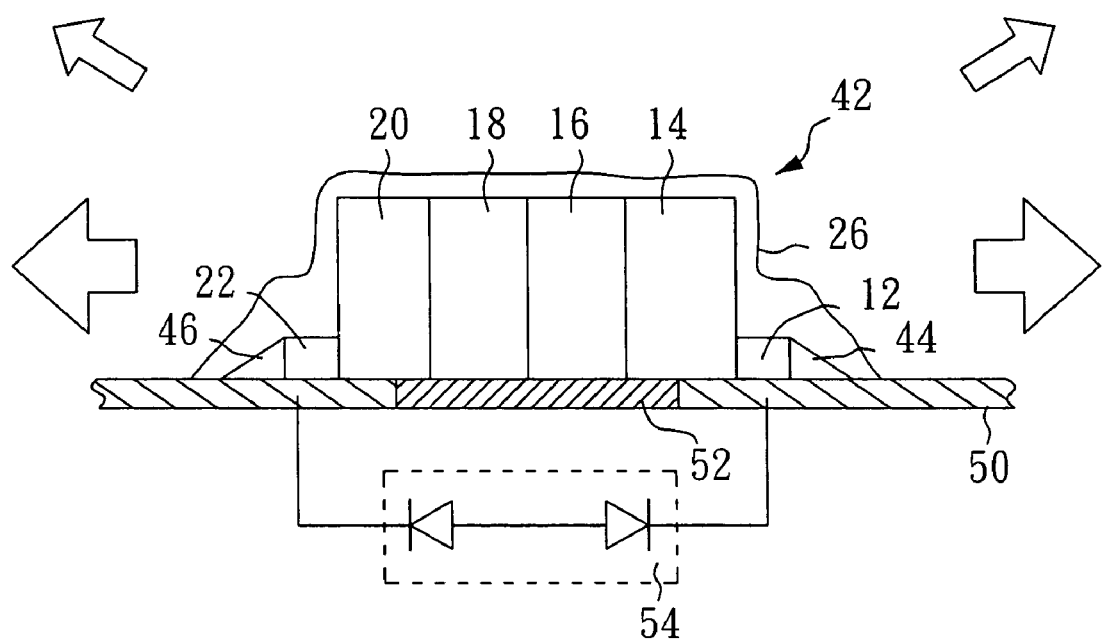
FIG. 6 is a schematic view of a side structure bare LED according to the present invention.

Referring to FIG. 6, the anode bonding pad 12 and the cathode bonding pad 22 are mounted to a carrying plate 50 via solders 44 and 46 respectively. As such, the bare LED 40 is fixedly mounted on the upper surface of the carrying plate 50 to complete a side structure of the bare LED 42 according to the present invention. The carrying plate 50 may be a metal plate capable of reflecting light by itself, a thermally conductive plate, ceramic plate or a printed circuit board (PCB). The layout of electric circuits (not shown) is formed on the upper surface or the interlayer of the carrying plate 50 so that the solders 44 and 46 are electrically connected to the positive and negative electrodes of the external power source respectively. Thus, the side structure of the bare LED 42 can be driven by a driving device in the known manner to emit light. In addition, a material 52 capable of thermal conductivity is applied to the surface of the carrying plate 50 by coating, sputtering or implanting. The material 52 is preferably a thermally conductive dielectric material. Hence, heat generated by the side structure of the bare LED 42 is speedily dissipated with the material 52. The side structure of the bare LED 42 therefore provides better heat dissipation. Further, an active device for dissipating heat such as a fan or a cooler or a passive device for dissipating heat such as fins can be mounted to the lower surface of the carrying plate 50 to improve the heat dissipation effect of the carrying plate 50. As a matter of course, an electrostatic discharge (ESD) circuit 54 can be designed in the carrying plate 50 so that the side structure of the bare LED 42 has an ESD protection function.

After the side structure of the bare LED 42 is mounted on the lateral side, a passivation layer 26 is coated or sputtered over the side structure of the bare LED 42. The passivation layer 26 has a refraction coefficient which is larger than the refraction coefficient of air (that is generally one) and smaller than the refraction coefficient of the side structure of the bare LED 42, the refraction coefficient of the surface of the side structure of the bare LED 42 being subject to the material thereof. Supposing the refraction coefficient of the surface of the side structure of the bare LED 42 is two and the refraction coefficient of the passivation layer 26 is a preferable 1.5, the side structure of the bare LED 42 will have a lower total reflection. As a result, not only does the brightness of the side structure of the bare LED 42 increase, but also the side structure of the bare LED 42 is prevented from oxidation and damages caused by humidity and other substances. As a matter of course, the passivation layer 26 can be disposed onto a plurality of the side structures of the bare LEDs 42 or the upper surface of the carrying plate 50 by coating or sputtering to provide full protection and to simplify the processing steps for the coating or sputtering.

Figure 7A:
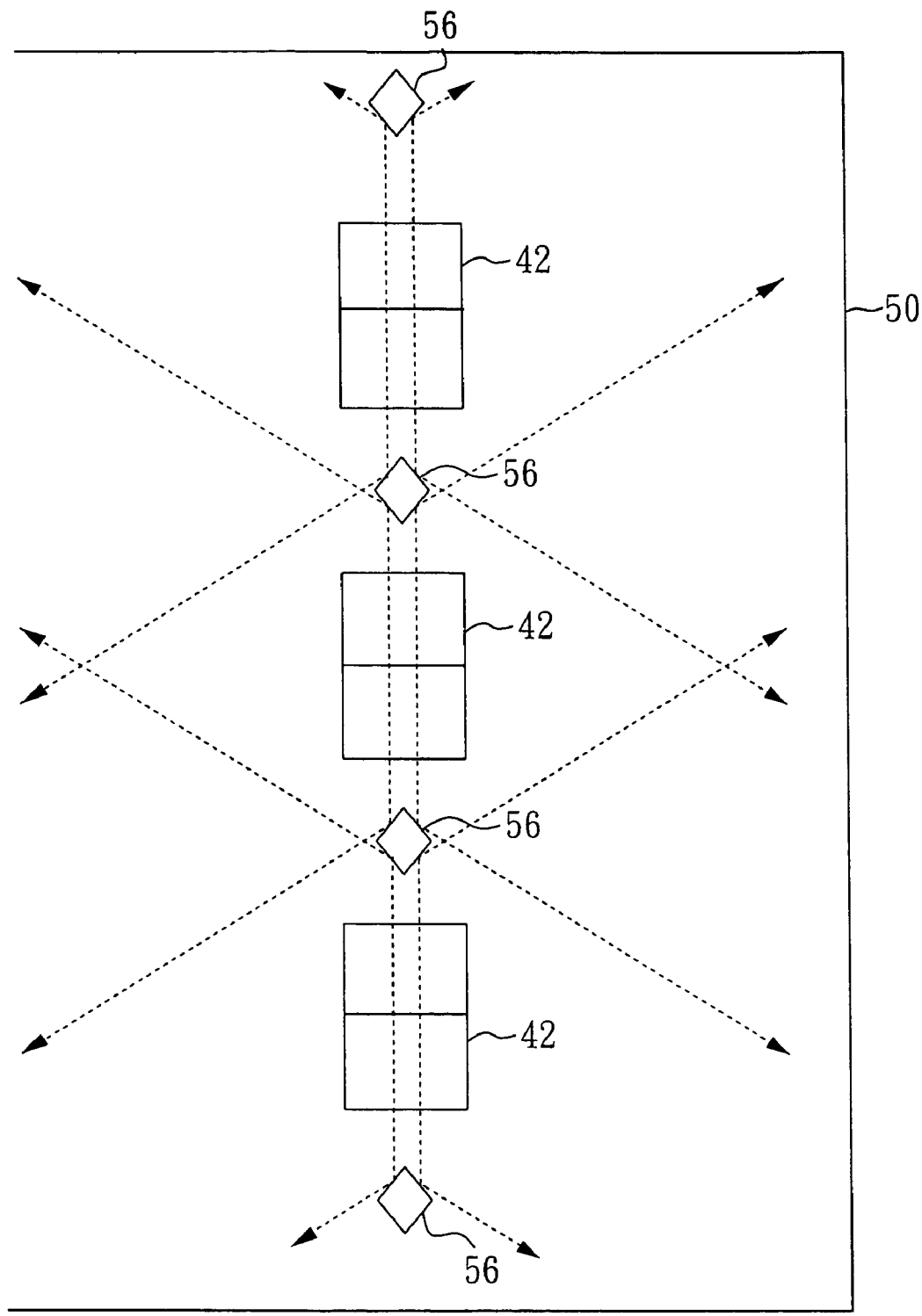
FIG. 7A is a schematic view of a direct-type backlight module and optically reflecting components according to the present invention.

Referring to FIG. 7A, a plurality of the side structures of the bare LEDs 42 are mounted on the carrying plate 50 having the passivation layer 26 coated or sputtered and a plurality of optical protrusions 56 are incorporated to form a direct type backlight module 60 of the present invention. Preferably, the optical protrusions 56 are metal plates to reflect light beams emitted from the side structures of the bare LEDs 42. Because the side structures of the bare LEDs 42 are placed horizontally, the light beams emitted from the side structures of the bare LEDs 42 diffuse transversely. Thus, a plurality of the side structures of the bare LEDs 42 are assembled to form an active light source of the direct type backlight module 60; and also, a plurality of optical protrusions 56 capable of reflecting (diffusing) light beams are incorporated so that the light beams emitted from the side structures of the bare LEDs 42 are mixed. Preferably, the side structures of the bare LEDs 42 include a quantity of the side structures of the bare LEDs 42 emitting red right, green light and blue light. After appropriate processes, red, green, blue or other colored light will become white light. Thus, the direct type backlight module 60 is capable of providing high-brightness white light to serve as the direct type backlight source of a liquid crystal display (LCD) or other display devices. As a matter of course, a plurality of the side structures of the bare LEDs 42 can be the side structures of the bare LEDs 42 emitting white light, in which the optical protrusions 56 provide only a reflection function without any light mixing effect. In addition, the driving voltage or proportion of the side structures of the bare LEDs 42 emitting red light, green light, blue light or other colored light is adjustable so that the direct type backlight module 60 can be used as a high-brightness light source of other colors including yellow, orange or purple in addition to the white light source.

Figure 7B:
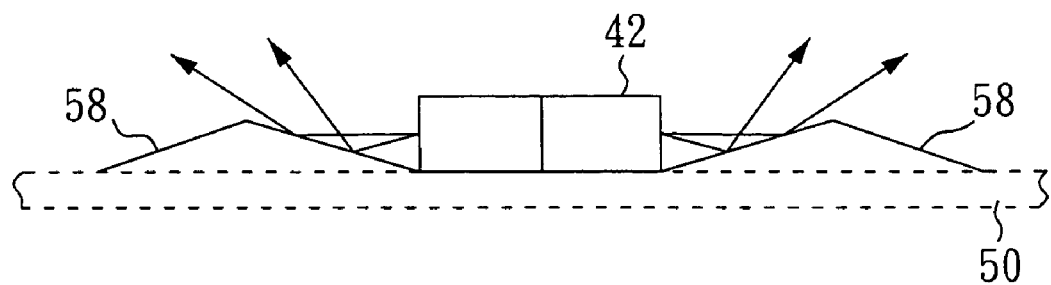
FIG. 7B is a schematic view of a direct-type backlight module and reflecting projections according to the present invention.
Figure 7C:
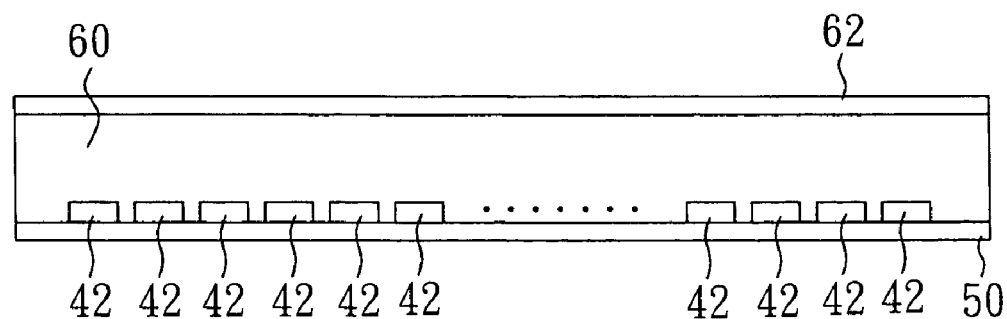
FIG. 7C is a schematic view of a direct-type backlight module incorporating a diffusing device according to the present invention.

Referring to FIG. 7B, the upper surface of the carrying plate 50 can be rugged to form reflecting projections 58 to replace the optical protrusions 56 for effecting the light reflection. Referring to FIG. 7C, a diffusing device 62 is incorporated into the direct type backlight module 60 so that the direct type backlight module 60 is capable of providing much more uniform light beams. Also, the direct type backlight module 60 can be well protected.

Preferably, the direct type backlight module 60 is mounted in the rear of a display panel to serve as the backlight source of the LCD. As a result, the light beams are emitted to the front side of the LCD. In addition, if the carrying plate 50 has a bar shape, the direct type backlight module 60 can also be used as a side-edge backlight module of the present invention. Preferably, the side-edge backlight module is mounted on one side of a display panel, and also, a light guide plate (not shown) is mounted in the rear of the display panel. As such, white light emitted from the side-edge backlight module can be provided uniformly to the display panel.

Because both the direct-type backlight module 60 and the side-edge backlight module are comprised of a quantity of the side structures of the bare LEDs 42, the brightness of both backlight modules is improved. Furthermore, the diffusing device 62 is incorporated to provide light luminance uniformity. The side structure of the bare LED 42 has a size so small that more side structures of the bare LEDs 42 can be employed within a unit area. Thus, both the direct-type backlight module 60 and the side-edge backlight module are capable of increasing the brightness within a unit area.

Although the present invention has been explained in relation to its preferred embodiments, it is to be understood that many other possible modifications and variations can be made without departing from the spirit and scope of the invention as hereinafter claimed.

What is claimed is:

1. A side structure of a bare light-emitting diode mounted on a surface of a carrying plate, comprising:
   a bare light-emitting diode, comprising: a first bonding pad;
   a substrate coupled to the first bonding pad;
   a P-type epitaxy coupled to the substrate;
   an active layer coupled to the P-type epitaxy;
   an N-type epitaxy coupled to the active layer; and a second bonding pad coupled to the N-type epitaxy; and
   at least two conductive materials coupled to the first bonding pad and said second bonding pad respectively so that the bare light-emitting diode is mounted on the surface of said carrying plate;
   wherein the area of the first bonding pad and the second bonding pad is smaller than the area of the active layer; and
   wherein the carrying plate is a metal plate covered with a dielectric material.

2. A side structure of a bare light-emitting diode mounted on a surface of a carrying plate, comprising:
   a bare light-emitting diode, comprising: a first bonding pad;
   a substrate coupled to the first bonding pad;
   a P-type epitaxy coupled to the substrate;
   an active layer coupled to the P-type epitaxy;
   an N-type epitaxy coupled to the active layer; and a second bonding pad coupled to the N-type epitaxy; and
   at least two conductive materials coupled to the first bonding pad and said second bonding pad respectively so that the bare light-emitting diode is mounted on the surface of said carrying plate;
   wherein the area of the first bonding pad and the second bonding pad is smaller than the area of the active layer;
   wherein the side structure of the bare light-emitting diode has a passivation layer on the surface thereof; and
   wherein the passivation layer has a refraction coefficient which is larger than a refraction coefficient of air and smaller than a refraction coefficient of the surface of side structure of the bare light-emitting diode.

3. A side structure of a bare light-emitting diode mounted on a surface of a carrying plate, comprising:
   a bare light-emitting diode, comprising: a first bonding pad;
   a substrate coupled to the first bonding pad;
   a P-type epitaxy coupled to the substrate;
   an active layer coupled to the P-type epitaxy;
   an N-type epitaxy coupled to the active layer; and a second bonding pad coupled to the N-type epitaxy; and
   at least two conductive materials coupled to the first bonding pad and said second bonding pad respectively so that the bare light-emitting diode is mounted on the surface of said carrying plate;
   wherein the area of the first bonding pad and the second bonding pad is smaller than the area of the active layer; and
   wherein said carrying plate has a heat dissipating device disposed on one surface thereof.

4. A backlight module serving as a backlight source of a display device, comprising:
   a carrying plate mounted with a material capable of thermal conduction; and
   a plurality of side structures of bare light-emitting diodes disposed on said carrying plate and in contact with the material;
   wherein each of the side structures of bare light-emitting diodes comprises a bare light-emitting diode, comprising a first bonding pad, a substrate coupled to the first bonding pad, a P-type epitaxy coupled to the substrate, an active layer coupled to the P-type epitaxy, an N-type epitaxy coupled to the active layer, a second bonding pad coupled to the N-type epitaxy, and at least two conductive materials coupled to the first bonding pad and the second bonding pad respectively so that the bare light-emitting diode is mounted on the surface of the carrying plate;
   wherein the area of the first bonding pad and the second bonding pad is smaller than the area of the active layer.

5. The backlight module of claim 4, wherein the backlight module further comprises a plurality of reflecting components mounted on the carrying plate.

6. The backlight module of claim 4, wherein the backlight module further comprises a diffusing device mounted over the carrying plate.

7. The backlight module of claim 4, wherein the backlight module serves as a direct type backlight source of the display device.

8. The backlight module of claim 4, wherein the backlight module serves as side-edge backlight source of the display device.

9. The backlight module of claim 4, wherein the display device is a liquid crystal display.

10. The backlight module of claim 4, wherein the carrying plate is a metal plate covered with a dielectric material.

11. The backlight module of claim 4, wherein the side structure of a bare light-emitting diode has a passivation layer disposed on the surface thereof.

12. The backlight module of claim 11, wherein the passivation layer has a refraction coefficient which is larger than a refraction coefficient of air and smaller than a refraction coefficient of the surface of side structure of the bare light-emitting diode.

13. The backlight module of claim 4, wherein a heat dissipating device is disposed on the carrying plate.

14. The backlight module of claim 4, wherein the substrate is a GaAs substrate.

15. The backlight module of claim 4, wherein the substrate is a GaP substrate.

* * * * *